(12) United States Patent
Jo et al.

(10) Patent No.: US 10,481,713 B2
(45) Date of Patent: Nov. 19, 2019

(54) DISPLAY DEVICE

(71) Applicant: Samsung Display Co., Ltd., Yongin-si, Gyeonggi-do (KR)

(72) Inventors: A Ra Jo, Yongin-si (KR); Sang Hyun Lim, Yongin-si (KR); Chang Sub Jung, Yongin-si (KR); Jae Woo Choi, Yongin-si (KR)

(73) Assignee: Samsung Display Co., Ltd. (KR)

( * ) Notice: Subject to any disclaimer, the term of this patent is extended or adjusted under 35 U.S.C. 154(b) by 69 days.

(21) Appl. No.: 15/374,871

(22) Filed: Dec. 9, 2016

(65) Prior Publication Data

US 2017/0168621 A1 Jun. 15, 2017

(30) Foreign Application Priority Data

Dec. 15, 2015 (KR) .................. 10-2015-0178965

(51) Int. Cl.
| | |
|---|---|
| *G06F 3/041* | (2006.01) |
| *G06F 3/044* | (2006.01) |
| *H01L 27/32* | (2006.01) |
| *H01L 51/52* | (2006.01) |
| *H05K 5/00* | (2006.01) |
| *H05K 5/02* | (2006.01) |
| *H05K 5/03* | (2006.01) |
| *H05K 7/14* | (2006.01) |

(52) U.S. Cl.
CPC ............ *G06F 3/0412* (2013.01); *G06F 3/044* (2013.01); *H01L 27/323* (2013.01); *H01L 51/5237* (2013.01); *H01L 51/5284* (2013.01); *H05K 5/0017* (2013.01); *H05K 5/0247* (2013.01); *H05K 5/03* (2013.01); *H05K 7/1427* (2013.01); *G06F 2203/04103* (2013.01); *G06F 2203/04105* (2013.01); *G06F 2203/04107* (2013.01); *H01L 27/3225* (2013.01)

(58) Field of Classification Search
None
See application file for complete search history.

(56) References Cited

U.S. PATENT DOCUMENTS

| | | | | |
|---|---|---|---|---|
| 2009/0266172 | A1* | 10/2009 | Casey ................... | G01L 9/0075 73/724 |
| 2011/0175845 | A1* | 7/2011 | Honda .................. | G06F 3/0414 345/174 |
| 2013/0162591 | A1* | 6/2013 | Hidaka ............... | H04M 1/0266 345/174 |
| 2014/0008203 | A1 | 1/2014 | Nathan et al. | |
| 2014/0028575 | A1 | 1/2014 | Parivar et al. | |
| 2016/0139702 | A1* | 5/2016 | Franklin ................. | G06F 3/044 345/174 |

\* cited by examiner

*Primary Examiner* — Benjamin C Lee
*Assistant Examiner* — Krishna P Neupane
(74) *Attorney, Agent, or Firm* — Innovation Counsel LLP (57) ABSTRACT

A display device may include a display panel, a window member provided above the display panel, a housing accommodating the display panel and the window member and including at least one protrusion on an inner surface thereof, and a pressure sensor including a first conductive layer provided on the at least one protrusion and a second conductive layer provided at a peripheral area of the first conductive layer to be spaced apart from the first conductive layer.

19 Claims, 5 Drawing Sheets

DISPLAY DEVICE

CROSS-REFERENCE TO RELATED APPLICATION

This application claims priority from and the benefit of Korean Patent Application No. 10-2015-0178965, Dec. 15, 2015, which is hereby incorporated by reference for all purposes as if fully set forth herein.

BACKGROUND

Field

Embodiments relate to a display device.

Discussion of the Background

Recently, the demand for a display device providing various functions has been increased.

SUMMARY

Embodiments provide a display device including a pressure sensor. The pressure sensor has a simple structure and may be manufactured at a low cost.

An embodiment discloses a display device including a display panel, a window member provided above the display panel, a housing accommodating the display panel and the window member and including at least one protrusion on an inner surface thereof, and a pressure sensor including a first conductive layer provided on the at least protrusion and a second conductive layer to be spaced apart from the first conductive layer and provided at a peripheral area of the first conductive layer.

According to an embodiment, the housing may include a bottom surface provided under the display panel, a lower sidewall surrounding a side surface of the display panel, an upper sidewall having a greater perimeter than the lower sidewall and surrounding a side surface of the window member, and a step portion provided between the lower sidewall and the upper sidewall and supporting an edge of a rear surface of the window member.

The protrusion may be on at least one area of the step portion.

The pressure sensor further comprises at least one circuit board provided between the edge of the window member and the step portion at a position corresponding to the protrusion and including an opening corresponding to the protrusion, and the second conductive layer is on at least one surface of the at least one circuit board.

The first conductive layer and the second conductive layer may be provided at different heights from the step portion.

The display device may further include a first adhesive layer between the edge of the window member and the circuit board and including an opening corresponding to the protrusion, and a second adhesive layer between the circuit board and the step portion and including an opening corresponding to the protrusion.

The step portion may be provided at each of at least two sidewalls opposite to each other among inner sidewalls of the housing, and at least one protrusion may be provided at the step portion provided at each of the at least two sidewalls.

The protrusion may protrude from the bottom of the housing toward the display panel.

The display device may further include a cushion member provided between the display panel and the bottom surface of the housing.

The cushion member may include the second conductive layer provided between the display panel and the bottom of the housing and including an opening corresponding to the protrusion.

The cushion member may further include a third adhesive layer between the display panel and the second conductive layer; and a light-shielding sheet between the display panel and the third adhesive layer and provided to completely cover a rear surface of the display panel.

The display device may further include a fourth adhesive layer between the second conductive layer and the bottom surface of the housing and including an opening corresponding to the protrusion.

The first conductive layer and the second conductive layer may be provided at different heights from the bottom surface of the housing.

The display panel may be embodied as an integrated touch screen display panel and further include a touch circuit board including a touch driving circuit connected to the display panel.

The second conductive layer may be electrically connected to the touch circuit is board.

DETAILED DESCRIPTION OF THE ILLUSTRATED EMBODIMENTS

Example embodiments will now be described more fully hereinafter with reference to the accompanying drawings to convey the scope of the example embodiments to those skilled in the art. However, they should not be construed as limited to the embodiments set forth herein. Rather, the present disclosure may be implemented in various forms, and the scope of the invention is not limited to the following embodiments.

Figure 1:
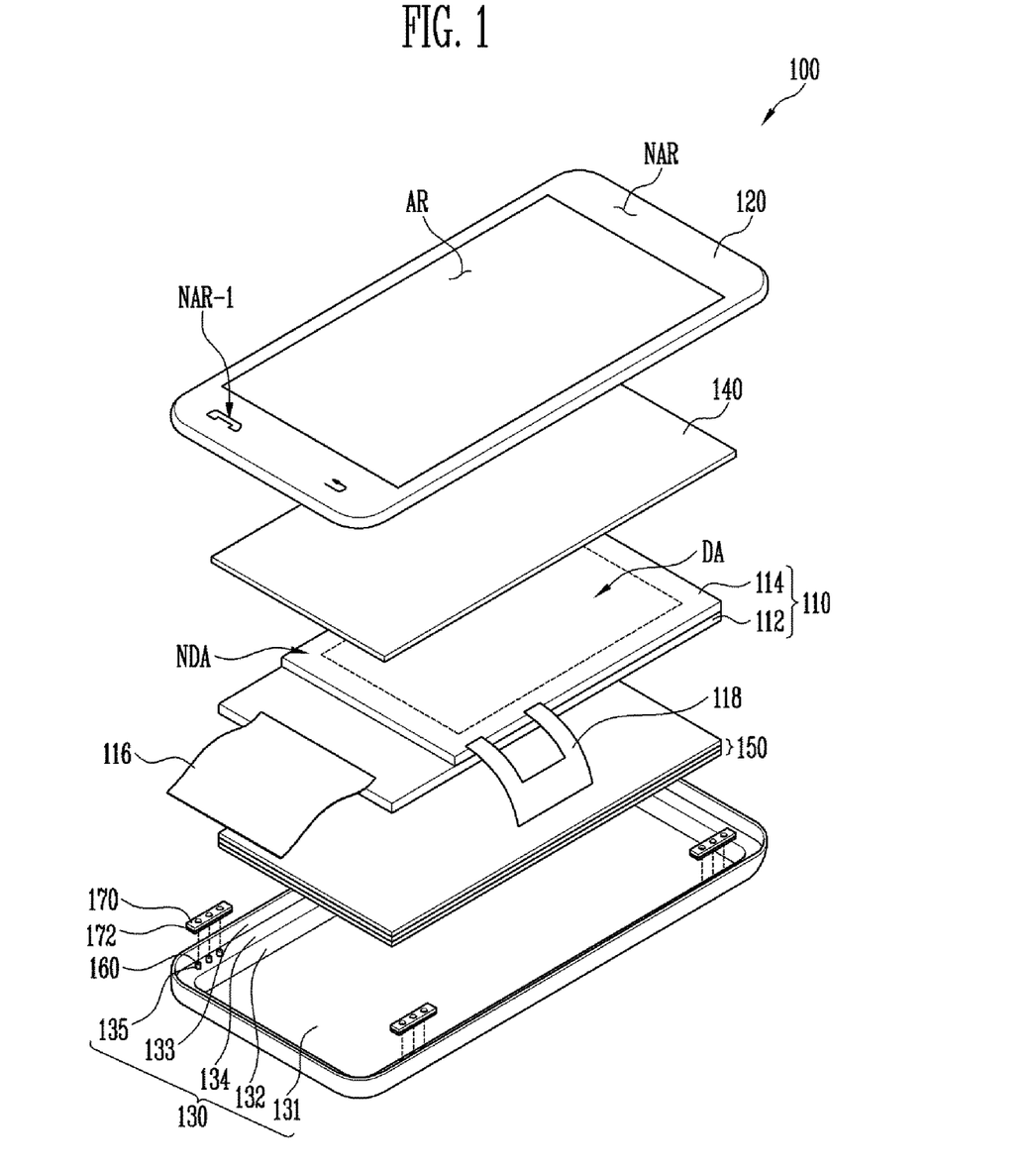
FIG. 1 is an exploded perspective view illustrating a display device according to an embodiment of the present disclosure.
Figure 2:
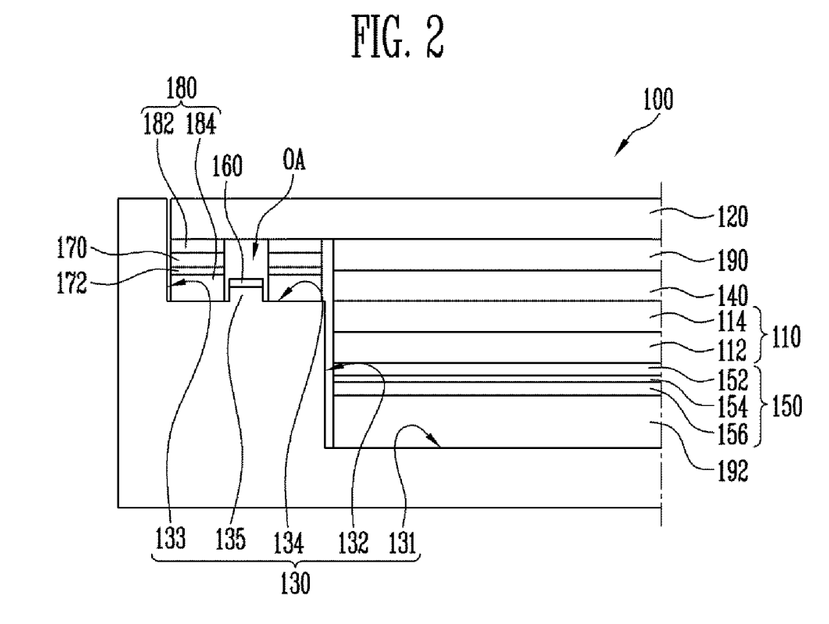
FIG. 2 is a partial cross-sectional view illustrating the display device shown in FIG. 1.

FIG. 1 is an exploded perspective view schematically illustrating a display device according to an embodiment of the present disclosure, and FIG. 2 is a partial cross-sectional view illustrating the display device shown in FIG. 1.

Figure 3:
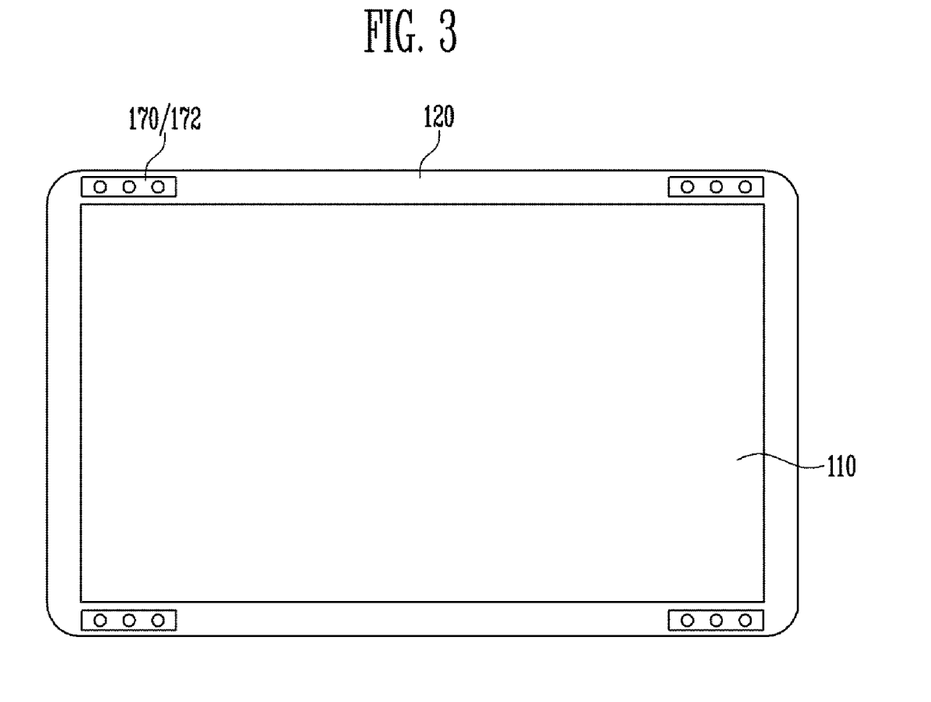
FIG. 3 is a plan view illustrating an example of arrangement of a pressure sensor circuit board shown in FIGS. 1 and 2.
Figure 4:
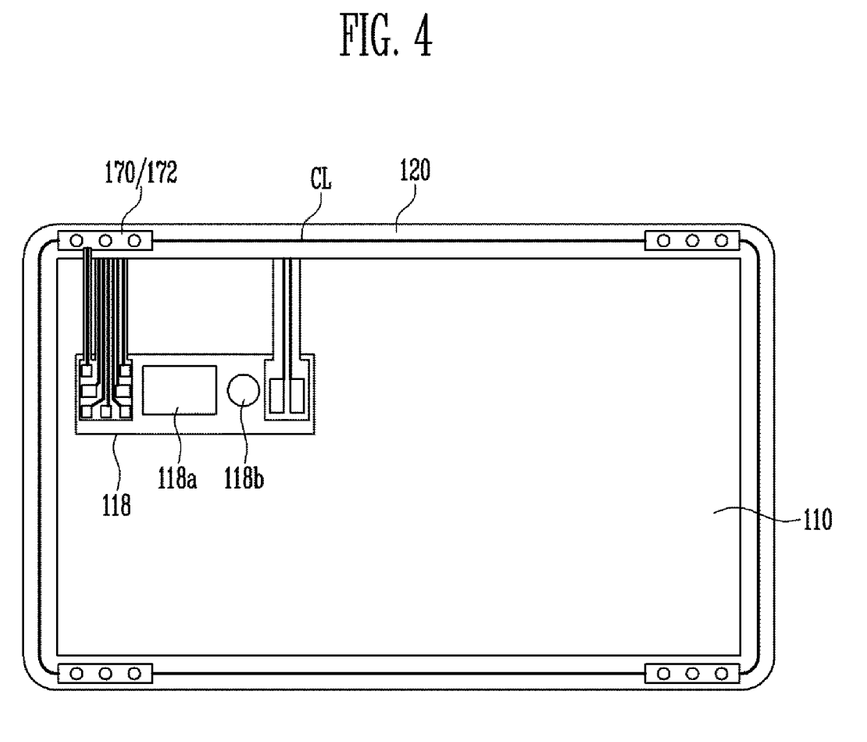
FIG. 4 is a plan view illustrating a connection structure of a pressure sensor and a driving circuit according to an embodiment of the present disclosure.

FIG. 3 is a plan view illustrating an example of arrangement of a pressure sensor circuit board shown in FIGS. 1 and 2, and FIG. 4 is a plan view illustrating a connection structure of a pressure sensor and a driving circuit according to an embodiment of the present disclosure.

Referring to FIGS. 1 and 2, a display device 100 according to an embodiment of the present disclosure may include a display panel 110 displaying an image, a window member 120 arranged above the display panel 110, and a housing 130 accommodating the display panel 110 and the window member 120. In addition, the display device 110 may further include a polarizing layer 140 between the display panel 110 and the window member 120 and a cushion member 150 between the display panel 110 and the housing 130.

In an embodiment, one or more protrusions 135 may be provided in an inner surface of the housing 130. A first conductive layer 160 may be provided on the protrusions 135. A second conductive layer 172 may be arranged adjacent to but spaced apart from the first conductive layer 160 at a peripheral area of the first conductive layer 160. The first conductive layer 160 and the second conductive layer 172 may constitute a first electrode and a second electrode of a pressure sensor for sensing a pressure in accordance with a touch input.

More specifically, the display panel 110 may include a display area DA for displaying an image, and a non-display area NDA outside the display area DA. The display panel 110 of the present disclosure is not limited to a particular type. For example, the display panel 110 may be a self-emission display panel such as an organic light emitting display (OLED) panel. Alternatively, the display panel 110 may be a non-emission display panel such as a liquid crystal display (LCD) panel. If the display panel 110 is the non-emission display panel, the display device 100 may further include a light source, for example, a back-light unit, which is not shown. Hereafter, an example embodiment in which the display panel is an organic light emitting display panel is described below.

The display panel 110 may include a first substrate 112 and a second substrate 114.

The first substrate 112 may include at least one thin film transistor provided on an insulating substrate and an organic light emitting diode connected thereto. The thin film transistor and the organic light emitting diode may be arranged in each pixel area of the display area DA.

The second substrate 114 may isolate the organic light emitting diode from an external environment. The second substrate 114 may be combined with the first substrate 112 by a sealing member such as a sealant. The sealing member may be provided in the non-display area NDA.

The display panel 110 may be electrically connected to a display circuit board 116 to receive a driving signal.

According to an embodiment, the display circuit board 116 may be a flexible printed circuit (FPC). The display circuit board 116 may be folded toward a rear surface of the display panel 110 and accommodated in the housing 130.

According to an embodiment, the display circuit board 116 may include various circuit components for driving the display panel 110 or electrically connect the display panel 110 to a main board, etc.

According to an embodiment, the display panel 110 may be embodied as an integrated touch screen display panel. For example, the display panel 110 may include a plurality of touch sensing patterns provided on at least one surface of the second substrate 114. For example, the touch sensing patterns may include a plurality of touch driving electrodes and a plurality of touch sensing electrodes arranged to be spaced apart from each other to intersect each other in the display area DA. For example, the touch driving electrodes and the touch sensing electrodes may be formed in different layers and overlap at intersecting points in a plan view.

When the display panel 110 is embodied as the integrated touch screen display panel, the display panel 110 may be electrically connected to a touch circuit board 118 to send and receive a signal for touch driving/sensing. For example, when touch sensing patterns are provided on an upper surface of the second substrate 114, the touch circuit board 118 may be electrically connected to the touch sensing patterns on the upper surface of the second substrate 114.

According to an embodiment, the touch circuit board 118 may be a flexible printed circuit (FPC). The touch circuit board 118 may be folded toward the rear surface of the display panel 110 and accommodated in the housing 130.

A connecting structure of the display panel 110 and the touch circuit board 118 may be variously changed.

The display circuit board 116 may not necessarily be separated from the touch circuit board 118. For example, the display circuit board 116 and the touch circuit board 118 may be integrated and embodied as a single circuit board.

In addition, when the display device 100 performs a touch screen function, the display panel 110 may not necessarily be embodied as the integrated touch screen display panel. For example, a touch screen panel manufactured as a separate configuration may be arranged above or under the display panel 110. In such a case, the display circuit board 116 may be electrically connected to the display panel 110, and the touch circuit board 118 may be electrically connected to a separate touch screen panel.

The window member 120 may be provided on a surface of the display panel 110 on which the image is displayed. For example, the window member 120 may be provided on the upper surface of the display panel 110.

According to an embodiment, the window member 120 may have a greater area than the display panel 110 and completely cover one surface of the display panel 110. That is, a width and/or a length of the window member 120 may be greater than those of the display panel 110.

The window member 120 may be combined with the housing 130 and cover the display device 110 along with the housing 130.

The window member 120 may include a light transmission area AR in which the image generated in the display panel 110 is transmitted and a light shieling area NAR outside the light transmission area AR.

The light transmission area AR may overlap at least the display area DA.

The light-shielding area NAR may overlap at least a portion of the non-display area NDA. An opaque border pattern layer such as a black matrix may be provided in the light-shielding area NAR.

In addition, at least a portion of the light-shielding area NAR may be defined as an icon area NAR-I. The icon area NAR-I may be activated when the display device 100 operates in a specific mode.

At least one polarizing layer 140 may be provided between the display panel 110 and the window member 120. The polarizing layer 140 may prevent the reduction of visibility of the image displayed in the display panel 110 due to light reflection. However, the polarizing layer 140 may be omitted according to an embodiment.

An adhesive 190 may be provided between the polarizing layer 140 and the window member 120. That is, the adhesive 190 may attach the display panel 110 to which the polarizing layer 140 is provided to the window member 120. When the polarizing layer 140 is not provided, the adhesive 190 may be directly disposed between the display panel 110 and the window member 120. The adhesive 190 may be formed of resin, for example.

The cushion member 150 may be provided under the display panel 110. For example, the cushion member 150 may be arranged between the display panel 110 and a bottom surface 131 of the housing 130.

The cushion member 150 may absorb external shocks applied to the display panel 110 and/or prevent interference caused by a signal or light.

To this end, the cushion member 150 may include various types of functional sheets for absorbing shocks and blocking and/or shielding light. For example, the cushion member 150 may include a tape, etc.

According to an embodiment, the cushion member 150 may include at least one of a shielding sheet 152, an adhesive layer 154 and a conductive layer 156.

The shielding sheet 152 may be formed of a black tape, for example. The shielding sheet 152 may be provided to completely cover the rear surface of the display panel 110.

The adhesive layer 154 may include at least an adhesive. For example, the adhesive layer 154 may be provided between the display panel 110 and the conductive layer 156.

The conductive layer 156 may be formed of a conductive tape, for example, a copper (Cu) tape.

In addition, the cushion member 150 may further include various types of functional sheets such as a foam tape.

According to an embodiment, at least one adhesive layer 192 may be further included between the cushion member 150 and the bottom surface 131 of the housing 130. The adhesive layer 192 may include at least an adhesive.

The housing 130 may accommodate at least the display panel 110 and the window member 120.

FIGS. 1 and 2 exemplify the housing 130 consisting of a single member. However, according to an embodiment, the housing 130 may consist of a combination of two or more members.

In the embodiment, a step portion 134 may be provided on an inner wall of the housing 130.

More specifically, the housing 130 according to an embodiment may include the bottom surface 131 arranged under the display panel 110, a lower side wall 132 surrounding a side wall of the display panel 110, an upper side wall 133 surrounding a side surface of the window member 120 having a greater perimeter than the lower side wall 132, and the step portion 134 provided between the lower side wall 132 and the upper side wall 133 and supporting an edge of a rear surface of the window member 120.

FIGS. 1 and 2 exemplify that the step portion 134 may be provided on four inner side walls of the housing 130, but the present disclosure is not limited thereto. For another example, the step portion 134 may be selectively provided on each of two inner side walls opposite to each other among the four inner side walls of the housing 130.

The housing 130 may be formed of plastic, metal, etc. When the housing 130 is formed of metal, such as magnesium Mg, the housing 130 may be electrically connected to a ground terminal.

The housing 130 according to an embodiment of the present disclosure may include one or more protrusions 135 provided on at least one surface of the step portion 134.

According to an embodiment, at least one protrusion 135 may be provided at the step portion 134 of each of two sidewalls opposite to each other. For example, FIGS. 1 and 2 exemplify the housing 130 in which three protrusions 135 are symmetrically provided in each of four areas adjacent to four corners of the step portion 134.

The first conductive layer 160 may be provided on the protrusion 135.

The second conductive layer 172 may be provided adjacent to but spaced apart from the first conductive layer 160 at a peripheral area of the first conductive layer 160.

For example, the display device 100 according to an embodiment of the present disclosure may include at least one pressure sensor circuit board 170 arranged between the edge of the rear surface of the window member 120 and the step portion 134 of the housing 130 in a position corresponding to the protrusion 135, and the second conductive layer 172 provided on at least one surface of the pressure sensor circuit board 170.

For example, when the three protrusions 135 are provided in each of the four areas adjacent to the four corners of the step portion 134 as shown in FIGS. 1 and 2, four pressure sensor circuit boards 170 may be arranged to correspond to the four areas in which the protrusions 135 are provided and include the second conductive layer 172 provided on one surface thereof. However, the present disclosure is not limited thereto, and the positions and numbers of the protrusions 135 and the pressure sensor circuit boards 170 may be variously changed.

A plurality of pressure sensor circuit boards 170 in which the second conductive layer 172 is provided may be arranged as shown in FIG. 3 for an exemplary case.

FIG. 3 is a schematic view of an arrangement structure of the display panel 110, the window member 120 and the pressure sensor circuit board 170 in a rear direction of the window member 120.

Referring to FIG. 3, four pressure sensor circuit boards 170 may be arranged to be adjacent to respective corners of the widow member 120 and not to overlap the display panel 110.

Referring back to FIGS. 1 and 2, an opening OA corresponding to the protrusion 135 may be provided on each pressure sensor circuit board 170 and the second conductive layer 172 on one surface of the pressure sensor circuit board 170.

Each opening OA may have a greater area than the protrusion 135 to completely accommodate the protrusion 135. Specifically, each opening OA may be provided so that the first conductive layer 160 and the second conductive layer 172 are arranged to be adjacent to each other but spaced apart from each other. Capacitance may be formed between the first conductive layer 160 and the second conductive layer 172.

Although it is disclosed in the embodiment shown in FIGS. 1 and 2 that an air gap is provided between the first conductive layer 160 and the second conductive layer 172 without a filling material, the present disclosure is not limited thereto. According to another embodiment, a non-conductive filling material may be provided between the first conductive layer 160 and the second conductive layer 172, so that insulation between the first conductive layer 160 and the second conductive layer 172 may be stably achieved.

According to an embodiment, the first conductive layer 160 and the second conductive layer 172 may be provided at different heights from the step portion 134. A height difference between the first conductive layer 160 and the second conductive layer 172 may be set to stably achieve the insulation therebetween and secure the capacitance to the extent that senses the pressure in accordance with the touch input.

An adhesive layer 180 for attaching the pressure sensor circuit board 170 to the window member 120 and the step portion 134 may be provided above and under the pressure sensor circuit board 170. The adhesive layer 180 may include an adhesive.

For example, the adhesive layer 180 may include a first adhesive layer 182 provided between the edge of the rear surface of the window member 120 and the pressure sensor circuit board 170, and a second adhesive layer 184 provided between the second conductive layer 172 and the step portion 134 of the housing 130 and corresponding to the protrusion 135.

According to an embodiment, an opening OA corresponding to the protrusion 135 may be provided on the first adhesive layer 182.

According to the structure described above, it is disclosed in an embodiment that the pressure sensor is provided with a simple structure and the pressure sensing function is provided in accordance with the touch input of the user through the pressure sensor. As a result, the display device 100 with improved usability may be provided.

More specifically, the display device 100 according to an embodiment may include a pressure sensor including the first conductive layer 160 and the second conductive layer 172 adjacent to each other but spaced apart from each other in the light-shielding area NAR.

For example, it is disclosed in the embodiment that the protrusion 135 may be provided on the step portion 134 of the housing 130 and the first conductive layer 160 may be provided on the protrusion 135. In addition, the opening OA may be large enough for the protrusion 135 to be sufficiently inserted, the pressure sensor circuit board 170 in which the second conductive layer 172 is provided on at least one surface thereof may be arranged on a position adjacent to the protrusion 135, and the pressure sensor circuit board 170 may be provided to a rear surface of the light-shielding area NAR of the window member 120.

The adhesive layer 180 used for attaching the pressure sensor circuit board 170 may include an adhesive having elasticity.

Therefore, when the touch input of the user occurs above the pressure sensor circuit board 170 or in a peripheral area thereof, the pressure may be directly or indirectly transmitted to the area in which the pressure sensor circuit board 170 is provided, thereby pressing the adhesive layer 180. Accordingly, as the distance between the first conductive layer 160 and the second conductive layer 172 is changed, the capacitance therebetween may be changed. Therefore, when the change of the capacitance is detected, the pressure sensing function in accordance with the touch input may be performed.

To provide the pressure sensing function, at least one of the first conductive layer 160 and the second conductive layer 172 may be electrically connected to the pressure sensing circuit.

According to an embodiment, the pressure sensing circuit may be mounted on the display circuit board 116 or the touch circuit board 118. However, the present disclosure is not limited thereto, and the pressure sensing circuit may be connected to a main board or a separate circuit board. For example, the pressure sensing circuit may be mounted on the touch circuit board 118.

The second conductive layer 172 may be electrically connected to the touch circuit board 118.

For example, as shown in FIG. 4, each of the plurality of pressure sensing circuit boards 170 including the second conductive layers 172 may be electrically connected to each other through a connecting line CL, and electrically connected to the touch circuit board 118.

A touch driving circuit 118a for driving a touch screen and a separate pressure sensing circuit 118b may be mounted on the touch circuit board 118.

However, the pressure sensing circuit 118b may not be separately included in some embodiments; instead, the pressure sensing circuit 118b may be included in the touch driving circuit 118a.

As described above, the display device 100 according to an embodiment may detect the pressure applied by the touch input of the user, and may be configured to perform additional functions.

For example, when the touch input of the user occurs in the light transmission area AR including the display area DA and/or the light-shielding area NAR, the pressure may be directly or indirectly transmitted to the area in which the first conductive layer 160 and the second conductive layer 172 are provided, thereby changing the distance between the first conductive layer 160 and the second conductive layer 172. Accordingly, the capacitance between the first conductive layer 160 and the second conductive layer 172 may be changed, and the change may be detected through the pressure sensing circuit 118b, so that display device 100 may be designed to perform a specific function corresponding to the touch input.

For example, when an amount of the change in the capacitance between the first conductive layer 160 and the second conductive layer 172 is set above a predetermined reference value, or within a predetermined range, the display device 100 may be designed to perform the preset function. That is, the display device 100 may be designed to detect the presence and/or intensity of the pressure and to perform a corresponding function.

For example, a preset value may be stored in the display device 100 so as to enlarge or reduce the image displayed on the display area DA when an amount of change in the capacitance between the first conductive layer 160 and the second conductive layer 172 is greater than a predetermined reference value.

Alternatively, an area where the first conductive layer 160 and the second conductive layer 172 are provided, that is, the pressure sensor itself, may consist of a predetermined function key. For example, when an amount of change in the capacitance between the first conductive layer 160 and the second conductive layer 172 is greater than a predetermined reference value, the display device 100 may be designed to perform the preset function.

Sensitivity and a pressure sensing area of the pressure sensor may be configured so as to comply with the design purpose, for example, by changing the location, size, or setting value of the pressure sensor.

According to the embodiment as described above, the pressure sensor with a relatively simple structure may be included in the display device 100 without having a separate pressure sensor circuit component or a separate pressure sensing sheet. Accordingly, it is possible to provide the pressure sensing display device 100 with a reduced production cost.

Further, according to the structure of the above-described pressure sensor, a pressure sensing function may be provided within the range that does not increase the thickness or insignificantly increase the thickness of the display device 100.

The display device 100 according to the embodiment provides a pressure sensing function even in case in which a separate touch screen function is not provided, thereby providing a predetermined additional function.

In addition, when the display device 100 provides a touch screen function, the pressure sensor may provide a pressure sensing function in addition to the touch screen function and coordinate detection functions provided through the touch screen.

Therefore, it is possible to vary the functions of the display device 100 and increase the usability.

Figure 5:
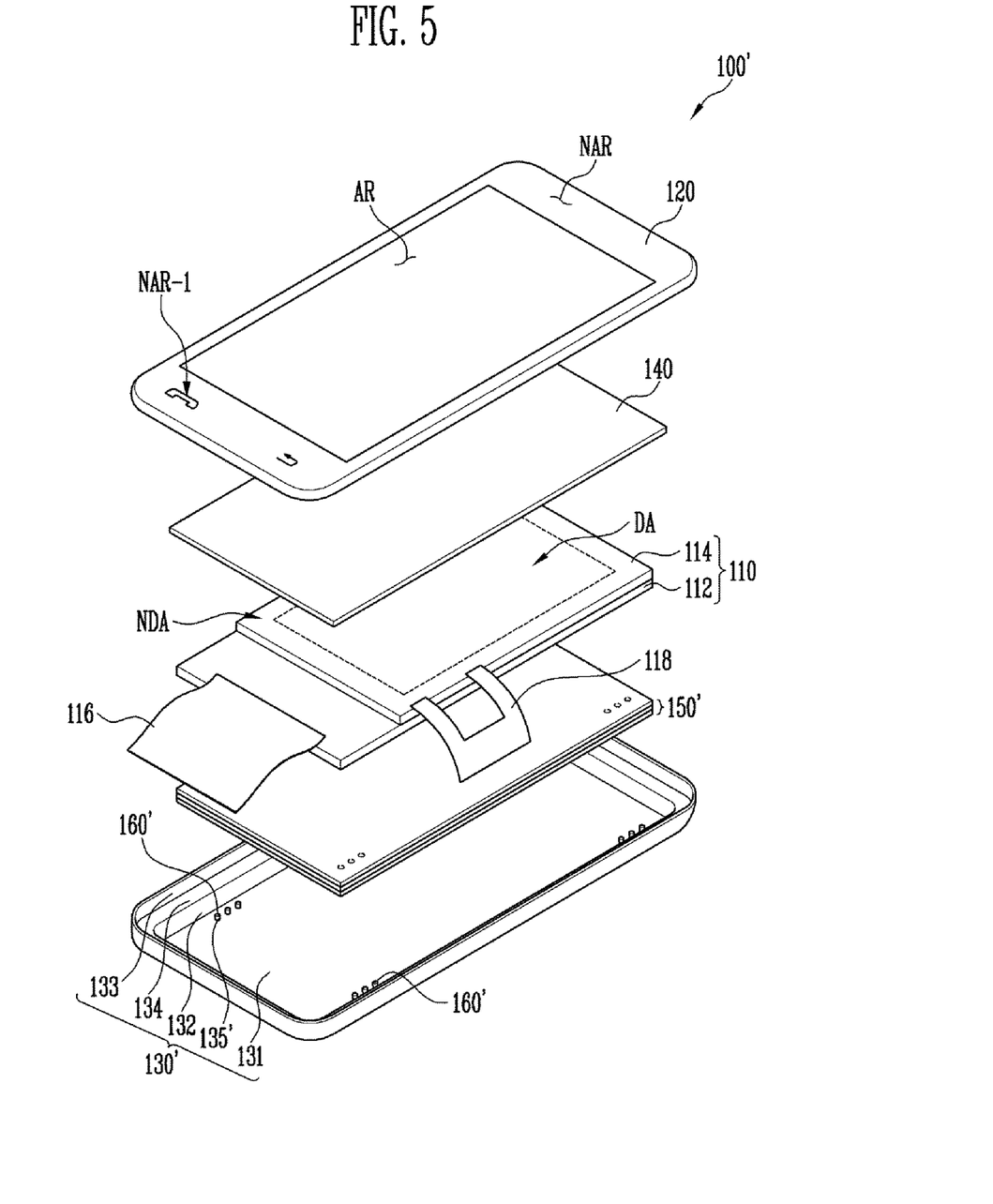
FIG. 5 is an exploded perspective view illustrating a display device according to another embodiment of the present disclosure.
Figure 6:
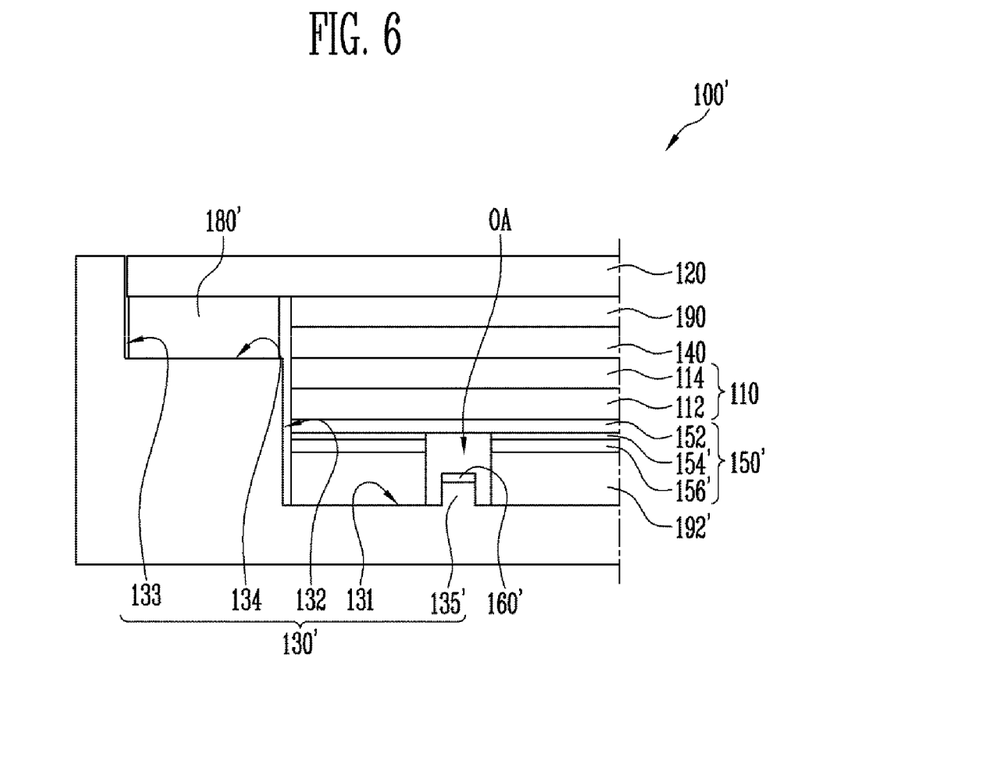
FIG. 6 is a partial cross-sectional view illustrating the display device shown in FIG. 5.

FIG. 5 is an exploded perspective view illustrating a display device according to another embodiment of the present disclosure, and FIG. 6 is a partial cross-sectional view illustrating the display device shown in FIG. 5. While describing FIGS. 5 to 6, like reference numerals refer to similar or like elements shown in FIGS. 1 and 2, and the detailed description thereof is omitted.

Referring to FIGS. 5 and 6, a display device 100' according to another embodiment of the present disclosure may include a protrusion 135' on a bottom surface 131 of a housing 130' that protrudes in a direction toward the display panel 110.

That is, the protrusion 135' of the embodiment may be provided on the bottom surface 131 instead of on the step portion 134. However, the present disclosure is not limited thereto. For example, the protrusion 135' may be provided on both of the bottom surface 131 and the step portion 134. That is, the positions and number of protrusions 135' may be variously changed.

A first conductive layer 160' that functions as a first electrode of the pressure sensor may be provided on the protrusion 135'.

In the embodiment of FIGS. 5 and 6, unlike the embodiment of FIGS. 1 to 4 consisting of the pressure sensor circuit board 170 in which the second conductive layer 172 is provided on the step portion 134, at least one conductive layer 156' included in a cushion member 150' may be used as a second electrode of the pressure sensor. That is, in an embodiment, the conductive layer 156' included in the cushion member 150' may function as the second electrode of the pressure sensor in replacement of the second conductive layer 172 shown in FIGS. 1 to 4.

The pressure sensor circuit board 170 and the second conductive layer 172 provided on one surface of the pressure sensor circuit board 170 shown in FIGS. 1 to 4 may be omitted. In addition, an adhesive layer 180' may be disposed between the edge of the rear surface of the window member 120 and the step portion 134 of the housing 130.

An opening OA corresponding to the protrusion 135' may be provided on the conductive layer 156' of the cushion member 150'. To stably achieve the insulation between two conductive layers 156' and 160' constituting the pressure sensor, the opening OA may be provided in a larger area than the protrusions 135'.

According to an embodiment, an opening OA corresponding to the protrusion 135' may be provided on an adhesive layer (a third adhesive layer; 154') arranged above the conductive layer 156' and an adhesive layer (a fourth adhesive layer; 192') arranged between the conductive layer 156' and the bottom surface 131 of the housing 130'.

According to an embodiment, the light-shielding sheet 152 may completely cover the rear surface of the display panel (110) without being opened to secure uniformity in the optical characteristic of the light transmission area AR.

According to an embodiment, the first conductive layer 160' and the conductive layer 156' of the cushion member 150' may be provided at different heights from the bottom surface 131 of the housing 130'.

The cushion member 150' including at least an adhesive may have elasticity. Thus, when the cushion member 150' is pressed, thereby changing the distance between the two conductive layers 156' and 160', the capacitance is changed. The pressure in accordance with the touch input may be detected by detecting the change of the capacitance.

The distance between the two conductive layers 156' and 160' without being pressed may be set to the desirable pressure sensing sensitivity.

At least one of the two conductive layers 156' and 160' in an embodiment may be electrically connected to the touch circuit board 118. Accordingly, the pressure sensing function may be provided.

The pressure sensor circuit board 170 illustrated in FIGS. 1 to 4 may be omitted in the display device 100' according to the embodiment as described above.

According to the embodiment, the pressure sensor may be provided with a simple structure without an increase of the thickness of the display device 100'. According to the display device 100' of the embodiment, the production cost may be reduced with various functions, and the usability may be improved.

According to an embodiment, the pressure sensor may be included in the display device and have a relatively simple structure. As a result, the display device having the additional pressure sensing function may be manufactured at a lower cost. The display device including the additional pressure sensing function may provide various functions and increase usability.

Embodiments are provided to illustrate the concepts of the invention. However, it should be understood that the invention is not limited to the specific embodiments thereof. Accordingly, it will be understood by those of skill in the art that various changes in form and details may be made without departing from the spirit and scope of the present invention as set forth in the following claims.

What is claimed is:

1. A display device, comprising:
   a display panel;
   a window provided above the display panel;
   a housing accommodating the display panel and the window and including at least one fixed protrusion on an inner surface thereof; and
   a pressure sensor including a first conductive layer provided on the at least one fixed protrusion and a second conductive layer provided at a peripheral area of the first conductive layer to be laterally spaced apart from the first conductive layer not to overlap the first conductive layer in a plan view,
   wherein the first conductive layer and the second conductive layer constitute a first electrode and a second electrode of the pressure sensor for sensing pressure responsive to vertical displacement of the second conductive layer relative to the first conductive layer upon applied pressure thereof to the second conductive layer to develop variable capacitance for the pressure sensor between the first electrode and the second electrode.

2. The display device of claim 1, wherein the housing comprises:
   a bottom surface provided under the display panel;
   a lower sidewall surrounding a side surface of the display panel;
   an upper sidewall having a greater perimeter than the lower sidewall and surrounding a side surface of the window; and
   a step portion provided between the lower sidewall and the upper sidewall and supporting an edge of a rear surface of the window.

3. The display device of claim 2, wherein the protrusion is on at least one area of the step portion.

4. The display device of claim 3, wherein the pressure sensor further comprises at least one circuit board provided between the edge of the rear surface of the window and the step portion at a position corresponding to the protrusion and including an opening corresponding to the protrusion, and the second conductive layer is on at least one surface of the at least one circuit board.

5. The display device of claim 4, wherein the first conductive layer and the second conductive layer are provided at different heights from the step portion.

6. The display device of claim 4, further comprising:
a first adhesive layer between the edge of the window and the circuit board and including an opening corresponding to the protrusion; and
a second adhesive layer between the circuit board and the step portion and including an opening corresponding to the protrusion.

7. The display device of claim 3, wherein the step portion is provided at each of at least two sidewalls opposite to each other among inner sidewalls of the housing, and at least one protrusion is provided at the step portion provided at each of the at least two sidewalls.

8. The display device of claim 2, wherein the protrusion protrudes from the bottom surface of the housing toward the display panel.

9. The display device of claim 8, further comprising a cushion provided between the display panel and the bottom surface of the housing.

10. The display device of claim 9, wherein the cushion comprises the second conductive layer provided between the display panel and the bottom surface of the housing and including an opening corresponding to the protrusion.

11. The display device of claim 10, wherein the cushion further comprises:
a third adhesive layer between the display panel and the second conductive layer; and
a light-shielding sheet between the display panel and the third adhesive layer and provided to completely cover a rear surface of the display panel.

12. The display device of claim 10, further comprising a fourth adhesive layer between the second conductive layer and the bottom surface of the housing and including an opening corresponding to the protrusion.

13. The display device of claim 10, wherein the first conductive layer and the second conductive layer are provided at different heights from the bottom surface of the housing.

14. The display device of claim 1, wherein the display panel is embodied as an integrated touch screen display panel and further comprises a touch circuit board
including a touch driving circuit connected to the display panel.

15. The display device of claim 14, wherein the second conductive layer is electrically connected to the touch circuit board.

16. The display device of claim 1, wherein the at least one protrusion including a first portion extends laterally from the inner surface of the housing and a second portion protruded from an upper surface of the first portion to a vertical direction, and
wherein the first conductive layer is disposed on the second portion and the second conductive layer is disposed on the first portion.

17. The display device of claim 16, wherein a height of the first conductive layer from the upper surface of the first portion is lower than a height of the second conductive layer from the upper surface of the first portion.

18. The display device of claim 17, further comprising a pressure sensor circuit board disposed between the window and the first portion.

19. The display device of claim 18, wherein the second conductive layer is disposed on the pressure sensor circuit board.

* * * * *